United States Patent
You et al.

(10) Patent No.: US 7,256,499 B1
(45) Date of Patent: Aug. 14, 2007

(54) ULTRA LOW DIELECTRIC CONSTANT INTEGRATED CIRCUIT SYSTEM

(75) Inventors: Lu You, San Jose, CA (US); Fei Wang, San Jose, CA (US); Minh Quoc Tran, Milpitas, CA (US); Lynne A. Okada, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 11/230,985

(22) Filed: Sep. 19, 2005

Related U.S. Application Data

(63) Continuation-in-part of application No. 10/679,050, filed on Oct. 2, 2003, now abandoned.

(51) Int. Cl.
*H01L 23/48* (2006.01)
*H01L 23/52* (2006.01)
*H01L 29/40* (2006.01)

(52) U.S. Cl. .................. 257/758; 438/623; 257/E21.16

(58) Field of Classification Search ................ 438/623, 438/759, 758; 257/758, E21.16, E21.192
See application file for complete search history.

(56) References Cited

U.S. PATENT DOCUMENTS

| 6,759,325 B2 * | 7/2004 | Raaijmakers et al. ....... 438/633 |
| 6,800,547 B2 * | 10/2004 | Lu et al. ..................... 438/624 |
| 2002/0000670 A1 | 1/2002 | Yau et al. |
| 2002/0130101 A1 | 9/2002 | Ekkert |

FOREIGN PATENT DOCUMENTS

TW  430970 A  4/2001

\* cited by examiner

*Primary Examiner*—Caridad Everhart
(74) *Attorney, Agent, or Firm*—Mikio Ishimaru

(57) ABSTRACT

An integrated circuit is provided including forming a porous ultra-low dielectric constant dielectric layer over a semiconductor substrate and forming an opening in the ultra-low dielectric constant dielectric layer. A dielectric liner is formed to line the opening to cover the pores in the ultra-low dielectric constant dielectric layer and a barrier layer is deposited to line the dielectric liner and conductor core is deposited to fill the opening over the barrier layer.

20 Claims, 3 Drawing Sheets

ULTRA LOW DIELECTRIC CONSTANT INTEGRATED CIRCUIT SYSTEM

CROSS-REFERENCE TO RELATED APPLICATION(S)

This application is a continuation-in-part of U.S. patent application Ser. No. 10/679,050 filed Oct. 2, 2003 now abandoned.

BACKGROUND

1. Technical Field

The present invention relates generally to semiconductor technology and more specifically to semiconductors having interconnects with ultra low dielectric constant layers.

2. Background Art

In the manufacture of integrated circuits, after the individual devices such as the transistors have been fabricated in and on a semiconductor substrate or wafer, they must be connected, or "wired", together to perform the desired circuit functions. This interconnection process is generally called "metallization" and is performed using a number of different photolithographic, deposition, and removal processes to create contacts to the transistors, wire/channels to the contacts, and vias interconnecting the channels where there are more than one level of channels.

There are a number of different metalization techniques, but generally, a device dielectric layer is deposited over the transistors, openings are formed through the device dielectric layer down to transistor junctions and gates, and the openings are filled with a conductive metal to form contacts.

In one technique called the "single damascene" or "single inlaid" process, the formation of the first channels starts with the deposition of a thin first channel stop layer on the device dielectric layer. The first channel stop layer is an etch stop layer which is subject to a photolithographic processing step which involves deposition, patterning, exposure, and development of a photoresist, and an anisotropic etching step through the patterned photoresist to provide openings to the contacts. The photoresist is then stripped.

A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched. The first channel dielectric layer is then subject to further photolithographic process and etching steps to form first channel openings in the pattern of the first channels. The photoresist is then stripped.

An optional thin adhesion layer is deposited on the first channel dielectric layer over the entire semiconductor wafer and lines the first channel openings to ensure good adhesion of subsequently deposited material to the first channel dielectric layer. The adhesion layer is a metal such as tungsten (W), titanium (Ti), or tantalum (Ta).

High conductivity metals, such as copper (Cu), diffuse easily through dielectric materials such as silicon oxide and silicon nitride. This diffusion can result in a conductive buildup and cause short circuits in the integrated circuits. To prevent diffusion, a diffusion barrier is deposited on the adhesion layer. For copper conductor materials, the diffusion barrier layer is composed of materials such as tantalum nitride (TaN), titanium nitride (TiN), or tungsten nitride (WN).

However, these nitride compounds have relatively poor adhesion to copper and relatively high electrical resistance so they are problematic. For simplicity, the adhesion and barrier layers are sometimes collectively referred to as a "barrier" layer herein.

For conductor materials, such as copper and copper alloys, which are deposited by electroplating, a seed layer is deposited on the barrier layer and lines the barrier layer in the first channel openings to act as an electrode for the electroplating process. Processes such as electroless, physical vapor, and chemical vapor deposition are used to deposit the seed layer.

A first conductor material is electroplated on the seed layer and fills the first channel opening. The first conductor material and the seed layer generally become integral, and are often collectively referred to as the conductor core when discussing the main current-carrying portion of the channels.

A chemical-mechanical polishing/planarization (CMP) process is then used to remove the first conductor material, the seed layer, and the barrier layer above the first channel dielectric layer so the materials and layers are coplanar with the dielectric layer. The CMP process leaves the first conductor "inlaid" in the first channel dielectric layer to form the first channels. When a thing dielectric layer is placed over the first channels as a final layer, it is called a "capping" layer and the single damascene process is completed. When the layer is processed further for placement of additional channels over it, the layer is a via stop layer.

In another technique called the "dual damascene" or "dual inlaid" process, vias and channels are formed at the same time, generally over a completed single damascene process series of first channels. Effectively, two levels of channels of conductor materials in vertically separated planes are separated by an interlayer dielectric (ILD) layer and interconnected by the vias.

The initial step of the dual damascene process starts with the deposition of a thin via stop layer over the first channels and the first channel dielectric layer if it has not already been deposited as a capping layer. The via stop layer is an etch stop layer which is subject to photolithographic processing using a photoresist and anisotropic etching steps to provide openings to the first channels. The photoresist is then stripped.

A via dielectric layer is formed on the via stop layer. Again, where the via dielectric layer is of an oxide material, such as silicon oxide, the via stop layer is a nitride, such as silicon nitride, so the two layers can be selectively etched. The via dielectric layer is then subject to further photolithographic process using a photoresist and etching steps to form the pattern of the vias. The photoresist is then stripped.

A second channel dielectric layer is formed on the via dielectric layer. Again, where the second channel dielectric layer is of an oxide material, such as silicon oxide, the via stop layer is a nitride, such as silicon nitride, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, a seed layer is deposited on the barrier layer and lines the barrier layer in the second channel openings and the vias.

A second conductor material is electroplated on the seed layer and fills the second channel openings and the vias.

A CMP process is then used to remove the second conductor material, the seed layer, and the barrier layer above the second channel dielectric layer to form the second channels. When a layer is placed over the second channels as a final layer, it is called a "capping" layer and the dual damascene process is completed.

The layer may be processed further for placement of additional levels of channels and vias over it. Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metallization process for conductor metals such as aluminum. The elimination of metal etch steps is important as the semiconductor industry moves from aluminum (Al) to other metallization materials, such as copper, which are very difficult to etch.

A major problem occurs with diffusion barrier materials, which must be formed in a very thick layer around the conductor metal in order to prevent diffusion of the conductor metal into the dielectric layer. The very thickness of the diffusion barrier layer reduces the advantage of using high conductivity materials, such as copper, which are desirable for high speed and good interconnections. Unfortunately, it has been found that an even thick layer of diffusion barrier material is required relative to size to prevent conductor metal diffusion into via and channel ultra-low dielectric constant dielectric layers.

Another major problem occurs with diffusion barrier materials and ultra-low dielectric constant dielectric materials has been obtaining good bonds between the two.

Solutions to these problems have been long sought but prior developments have not taught or suggested any solutions and, thus, solutions to these problems have long eluded those skilled in the art.

DISCLOSURE OF THE INVENTION

The present invention provides an integrated circuit including forming a porous ultra-low dielectric constant dielectric layer over a semiconductor substrate and forming an opening in the ultra-low dielectric constant dielectric layer. A dielectric liner is formed to line the opening to cover the pores in the ultra-low dielectric constant dielectric layer and a barrier layer is deposited to line the dielectric liner and a conductor core is deposited to fill the opening over the barrier layer.

The present invention further provides a method for manufacturing an integrated circuit having a semiconductor substrate with a semiconductor device. An ultra-low dielectric constant dielectric layer is formed over the semiconductor substrate and an opening is formed in the ultra-low dielectric constant dielectric layer. A dielectric liner is formed to line the opening and a barrier layer is deposited to line the dielectric liner and a conductor core is deposited to fill the opening over the barrier layer.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
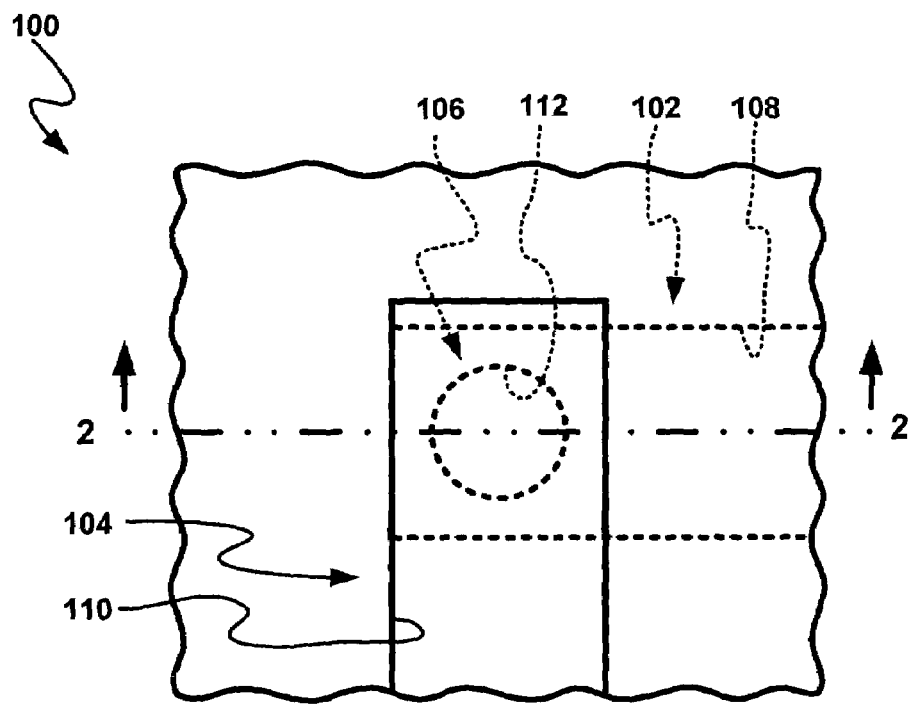
FIG. 1 (PRIOR ART) shows a plan view of aligned channels with a connecting via.

Referring now to FIG. 1 (PRIOR ART), therein is shown a plan view of a semiconductor wafer 100 including a silicon semiconductor substrate (not shown) having as interconnects first and second channels 102 and 104 connected by a via 106. The first and second channels 102 and 104 are respectively disposed in first and second channel dielectric layers 108 and 110. The via 106 is an integral part of the second channel 104 and is disposed in a via dielectric layer 112.

The term "horizontal" as used in herein is defined as a plane parallel to the conventional plane or surface of a wafer or substrate, regardless of its orientation. The term "vertical" refers to a direction perpendicular to the horizontal as just defined. Terms, such as "above", "below", "side" (as in "sidewall"), "higher", "lower", "over", and "under", are defined with respect to the horizontal plane. The term "on" means that there is direct contact between two elements or components.

The term "processing" as used herein includes deposition of material or photoresist, patterning, exposure, development, etching, cleaning, and/or removal of the material or photoresist as required in forming a described structure.

Figure 2:
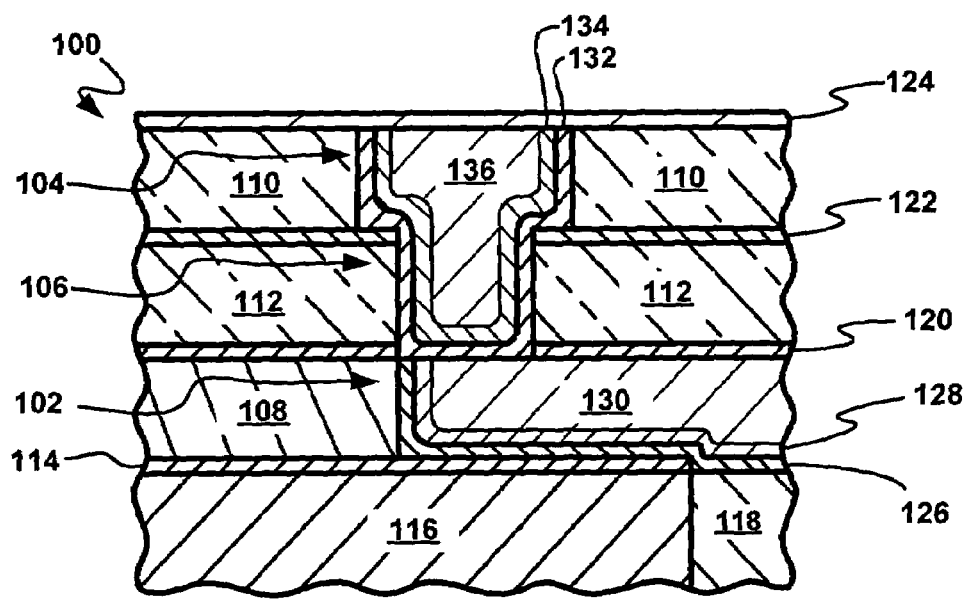
FIG. 2 (PRIOR ART) shows a cross-section of FIG. 1 (PRIOR ART) along line 2-2.

Referring now to FIG. 2 (PRIOR ART), therein is shown a cross-section of FIG. 1 (PRIOR ART) along line 2-2. A portion of the first channel 102 is disposed in a first channel stop layer 114 and is on a device dielectric layer 116, which is on the silicon semiconductor substrate. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a capping or via stop layer 124.

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. The seed layers 128 and 134 form electrodes on which the conductor material of the conductor cores 130 and 136 is deposited. The seed layers 128 and 134 are of substantially the same conductor material as the conductor cores 130 and 136 and become part of the respective conductor cores 130 and 136 after the deposition.

In the following description, numerous specific details are given to provide a thorough understanding of the invention. However, it will be apparent to one skilled in the art that the invention may be practiced without these specific details. In order to avoid obscuring the present invention, some well-known configurations and process steps are not disclosed in detail. In addition, the drawings showing embodiments of the apparatus are semi-diagrammatic and not to scale and, particularly, some of the dimensions are for the clarity of presentation and may be exaggerated in the drawing FIGs. The same numbers will be used in all the drawing FIGs. to relate to the same elements.

Figure 3:
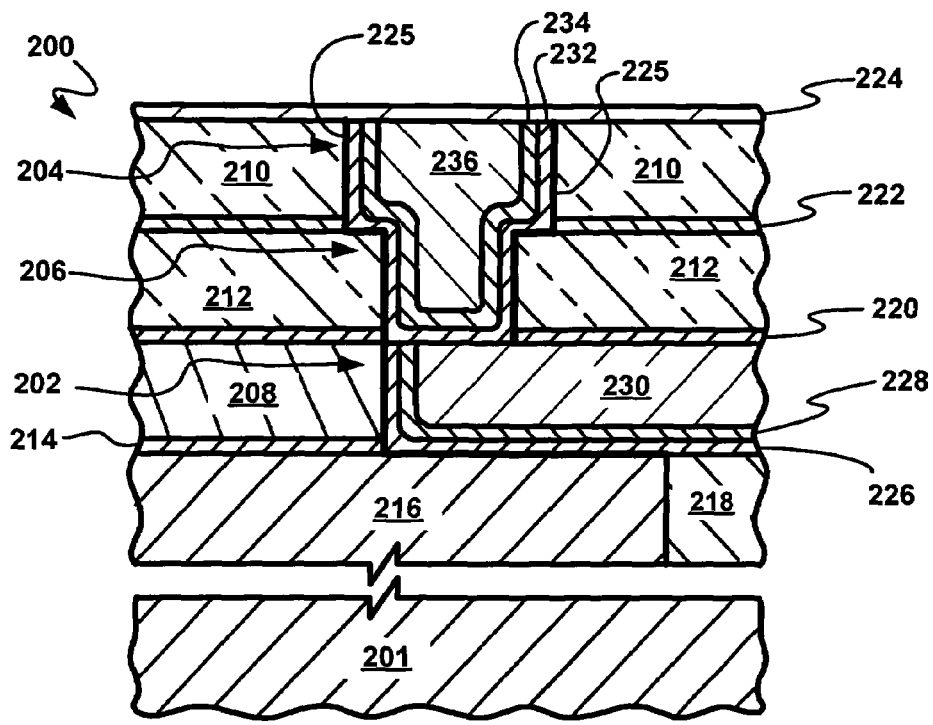
FIG. 3 shows a cross-section of a portion of an integrated circuit according to an embodiment of the present invention.

Referring now to FIG. 3, therein is shown a cross-section of a portion of an integrated circuit system 200 according to an embodiment of the present invention. A semiconductor substrate, which may be part of a singulated semiconductor wafer 201, has ultra-low dielectric constant dielectric layers having first and second channels 202 and 204 connected by a via 206 formed therein. The first and second channels 202 and 204 are respectively disposed in first and second ultra-low dielectric constant channel dielectric layers 208 and 210. The via 206 is a part of the second channel 204 and is disposed in a via ultra-low dielectric constant dielectric layer 212.

A portion of the first channel 202 is disposed in a first channel stop layer 214 and is on a device dielectric layer 216. Generally, metal contacts (not shown) are formed in the device dielectric layer 216 to connect to an operative semiconductor device (not shown) on the semiconductor substrate. This is represented by the contact of the first channel 202 with a semiconductor device gate 218 embedded in the device dielectric layer 216. The various layers above the device dielectric layer 216 are sequentially: the first channel stop layer 214, the first channel ultra-low dielectric constant dielectric layer 208, a via stop layer 220, the via ultra-low dielectric constant dielectric layer 212, a second channel stop layer 222, the second channel ultra-low dielectric constant dielectric layer 210, and a next channel stop layer 224.

Ultra-low dielectric constant dielectric materials are dielectric materials having dielectric constants below 2.5. Examples of such materials include commercially available Teflon, Teflon-AF, Teflon microemulsion, polimide nanofoams, silica aerogels, silica xerogels, and mesoporous silica.

The exemplary ultra-low dielectric constant materials have been found to be porous, which means that they present porous voids and highly irregular surfaces in the rectangular openings formed for the first and second channels 202 and 204, and in the generally cylindrical opening for the via 206.

It has been found that the porous voids and highly irregular surfaces due to pores intersecting the channels and vias are the source of the problems of using ultra-low dielectric constant dielectric materials, especially when the pores are interconnected. The irregularities mean that there is high surface diffusion for metal and metal ions, which in turn means that a greater thickness of diffusion barrier material is required, which increases resistance of the channels and vias. The pores also mean that there are areas where the diffusion barrier material is over a pore and not in contact with any material, which results in poor adhesion between the diffusion barrier material and the ultra-low dielectric constant dielectric material.

It has been discovered in the present invention that it is possible to seal the surfaces of the channels and vias by depositing a dielectric liner 225 having another dielectric constant differing from the ultra-low dielectric constant dielectric material. The dielectric liner 225 can even have a higher dielectric constant without substantially affecting the overall ultra-low dielectric constant of the integrated circuit system 200. The dielectric liner 225 is deposited on the first channel stop layer 214, the first channel ultra-low dielectric constant dielectric layer 208, a via stop layer 220, the via ultra-low dielectric constant dielectric layer 212, a second channel stop layer 222, and the second channel ultra-low dielectric constant dielectric layer 210.

The first channel 202 includes a barrier layer 226 and a seed layer 228 around a conductor core 230. The second channel 204 and the via 206 include a barrier layer 232 and a seed layer 234 around a conductor core 236. The barrier layers 226 and 232 are used to prevent diffusion of the conductor materials into the adjacent areas of the semiconductor device. The fully dense, non-porous, conformal dielectric layer forming the dielectric liner 225 provides a surface to which the barrier layers 226 and 232 can bond well and uniformly so a thinner layer may be used to maintain a low resistance of the channels and vias.

The seed layers 228 and 234 form electrodes on which the conductor material of the conductor cores 230 and 236 is deposited. The seed layers 228 and 234 are of substantially the same conductor material of the conductor cores 230 and 236 and become part of the respective conductor cores 230 and 236 after the deposition.

In various embodiments, the diffusion barrier layers are of materials such as tantalum (Ta), titanium (Ti), tungsten (W), alloys thereof, and compounds thereof. The seed layers (where used) are of materials such as copper (Cu), gold (Au), silver (Ag), alloys thereof, and compounds thereof with one or more of the above elements. The conductor cores with or without seed layers are of conductor materials such as copper, aluminum (Al), gold, silver, alloys thereof, and compounds thereof.

Figure 4:
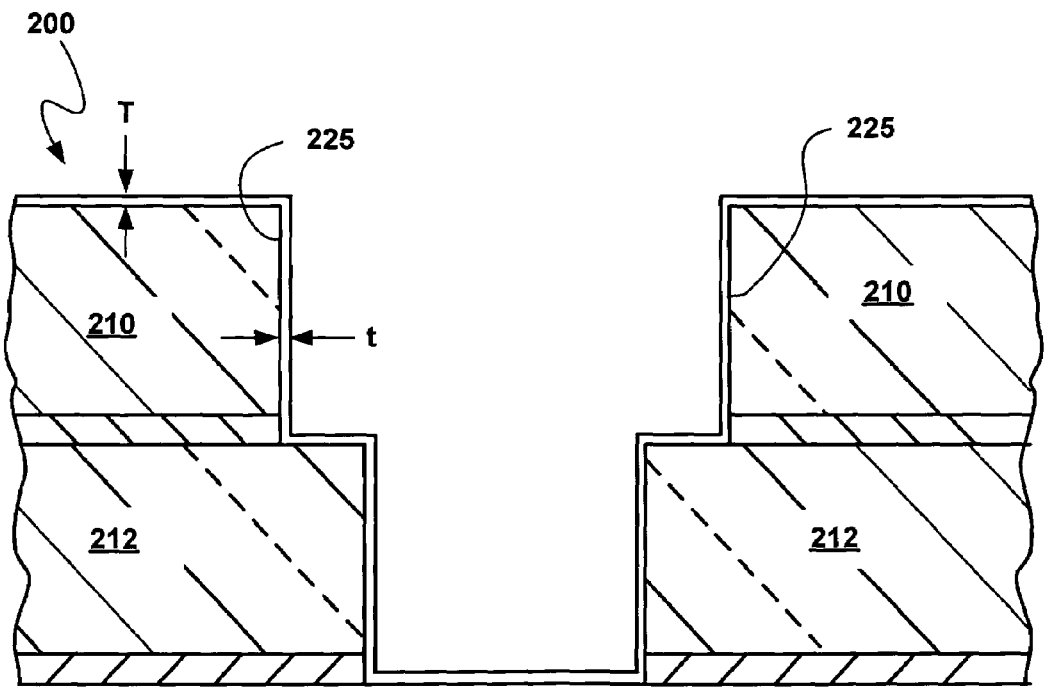
FIG. 4 shows a close-up view of the structure of FIG. 3.

Referring now to FIG. 4, therein is shown a close-up view of the structure of FIG. 3. The dielectric liner 225 is a conformal layer, which means that the thickness of the dielectric liner 225 does not vary more than 20% between horizontal and vertical surfaces. Thus, if the thickness "T" is taken as 100% thickness, the thickness "t" is not less than 80% of the thickness "t".

Figure 5:
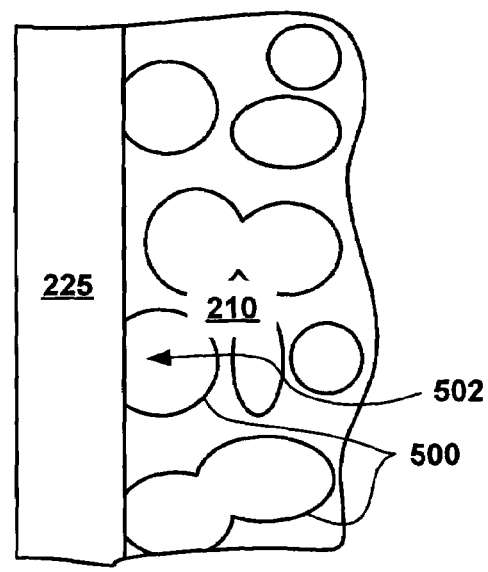
FIG. 5 shows a very close view of the structure of FIG. 4.

Referring now to FIG. 5, therein is shown a very close view of the structure of FIG. 4. The dielectric liner 225 is deposited to cover the first and second ultra-low dielectric constant channel dielectric layers 208 and 210 as shown in FIG. 4 to close the pores. As exemplified in FIG. 5, pores 500 in the ultra-low dielectric constant material can be open or closed cells. The dielectric liner 225 covers the open pore 500 at an area 502 without contacting the inner surface of the open pore 500.

It has been found that various dielectric materials that are fully dense, non-porous, and able to be deposited as a conformal cover layer are preferred for the dielectric liner 225.

Examples of the dielectric liner 225 are dielectric materials such as silicon oxide $(SiO_x)$, $(Si_xN_x)$, silicon oxynitride (SiON), tetraethylorthosilicate (TEOS), borophosphosilicate (BPSG) glass, etc. with dielectric constants from 4.2 to 3.9 or low dielectric constant dielectric materials such as fluorinated tetraethylorthosilicate (FTEOS), hydrogen silsesquioxane (HSQ), bis-benzocyclobutene (BCB), TMOS (tetramethylorthosilicate), OMCTS (octamethyleyclotetrasiloxane), HMDS (hexamethyldisiloxane), SOB (trimethylsilil borxle), DADBS (diaceloxyditerliarybutosiloxane), SOP (trimethylsilil phosphate), etc. with dielectric constants below 3.9 to 2.5. Other materials for the dielectric liner 225, which will provide the required pore sealing or blocking include: SiCO:H, SiC:H, from 3MS, 4MS or other precursors; CVD deposited Parylene (PPX, poly-p-xylylene) polymer and its derivatives (with dielectric constants of 2.7 to 2.3) using respective precursors; and DSI (of Fremont, Calif.) Epsilon-2000 CVD ULK polymer (having a dielectric constant of 2.2).

Chemical vapor deposition has been found to form a 100% conformal liner with some of the above dielectric materials.

In the present technology, it has been found that the dielectric liner 225 should have a thickness in the range from 6.4 to 2.4 nm.

Additional advantages to using the above dielectric material include an extensive knowledge base of these materials because of their long use in semiconductor processing and the availability of the necessary deposition equipment.

Figure 6:
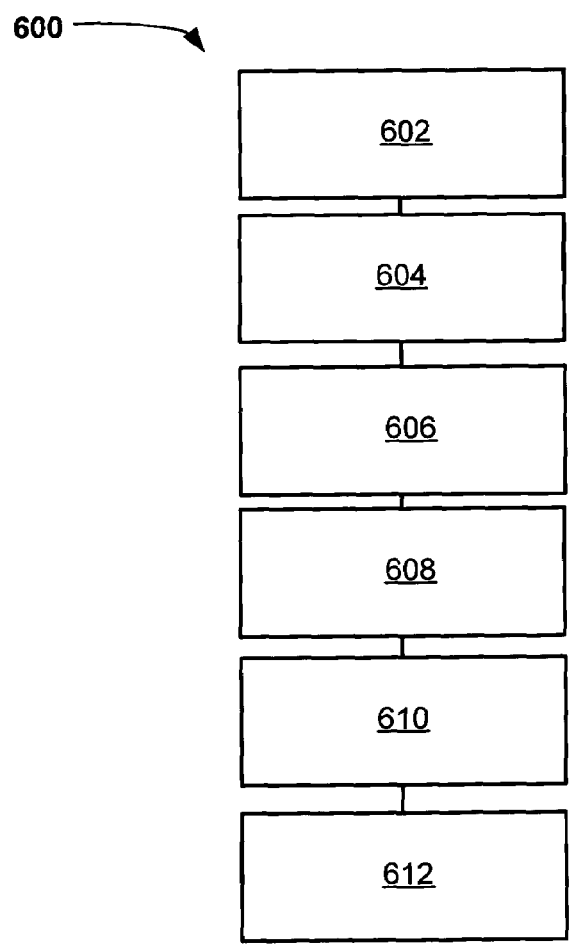
FIG. 6 shows an integrated circuit system for manufacturing the integrated circuit according to an embodiment of the present invention.

Referring now to FIG. 6, therein is shown an integrated circuit system 600 for manufacturing the integrated circuit system 200 according to an embodiment of the present invention. The system 600 includes: providing a semiconductor substrate having a semiconductor device provided thereon in a block 602; forming a porous ultra-low dielectric constant dielectric layer over the semiconductor substrate in a block 604; forming an opening in the ultra-low dielectric constant dielectric layer in a block 606; forming a dielectric liner to line the opening in the ultra-low dielectric constant dielectric layer and to cover pores in the ultra-low dielectric constant dielectric layer in a block 608; depositing a barrier layer to line the dielectric liner in a block 610; and depositing a conductor core over the barrier layer to fill the barrier layer and connect to the semiconductor device in a block 612.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope and equivalents of the included claims. All matters hithertofore set forth or shown in the accompanying drawings are to be interpreted in an illustrative and non-limiting sense.

The invention claimed is:

1. An integrated circuit system for manufacturing an integrated circuit system comprising:
   providing a semiconductor substrate having a semiconductor device provided thereon;
   forming a porous ultra-low dielectric constant dielectric layer over the semiconductor substrate;
   forming an opening in the ultra-low dielectric constant dielectric layer;
   forming a dielectric liner to line the opening in the ultra-low dielectric constant dielectric layer without contacting inner surfaces of pores in the ultra-low dielectric constant dielectric layer;
   depositing a barrier layer to line the dielectric liner; and
   depositing a conductor core over the barrier layer to fill the barrier layer and connect to the semiconductor device.

2. The system as claimed in claim 1 wherein forming the dielectric liner forms a material with a dielectric constant higher than the dielectric constant of the ultra-low dielectric constant dielectric layer.

3. The system as claimed in claim 1 wherein forming the dielectric liner forms a conformal layer on the porous ultra-low dielectric constant dielectric layer.

4. The system as claimed in claim 1 wherein forming the dielectric liner forms a non-porous conformal liner.

5. The system as claimed in claim 1 wherein depositing the barrier layer uses a material selected from a group consisting of tantalum, titanium, tungsten, a compound thereof, and a combination thereof.

6. An integrated circuit system for manufacturing an integrated circuit system comprising:
   providing a semiconductor substrate having a semiconductor device provided thereon;
   depositing a porous ultra-low dielectric constant dielectric layer over the semiconductor substrate, depositing the ultra-low dielectric constant dielectric layer deposits a dielectric material having a dielectric constant under 2.5;
   forming an opening in the ultra-low dielectric constant dielectric layer;
   depositing a dielectric liner to line the opening in the ultra-low dielectric constant dielectric layer without contacting inner surfaces of pores in the ultra-low dielectric constant dielectric layer;
   depositing a barrier layer to line the dielectric liner; and
   depositing a conductor core over the barrier layer to fill the barrier layer and connect to the semiconductor device.

7. The system as claimed in claim 6 wherein depositing the dielectric liner deposits a material with a dielectric constant under 4.2.

8. The system as claimed in claim 6 wherein depositing the dielectric liner deposits a material with a dielectric constant under 3.9.

9. The system as claimed in claim 6 wherein forming the dielectric liner deposits a non-porous conformal liner of a thickness in the range from 6.4 to 2.4 nm.

10. The system as claimed in claim 6 wherein depositing the barrier layer uses a material selected from a group consisting of tantalum, titanium, tungsten, a compound thereof, and a combination thereof.

11. An integrated circuit system comprising:
    a semiconductor substrate having a semiconductor device provided thereon;
    a porous ultra-low dielectric constant dielectric layer over the semiconductor substrate having an opening provided therein;
    a dielectric liner lining the opening in the ultra-low dielectric constant dielectric layer without contacting the inner surfaces of pores in the ultra-low dielectric constant dielectric layer;
    a barrier layer lining the dielectric liner; and
    a conductor core over the barrier layer to fill the barrier layer and connect to the semiconductor device.

12. The system as claimed in claim 11 wherein the dielectric liner is a material with a dielectric constant higher than the dielectric constant of the ultra-low dielectric constant dielectric layer.

13. The system as claimed in claim 11 wherein the dielectric liner is a conformal layer on the porous ultra-low dielectric constant dielectric layer.

14. The system as claimed in claim 11 wherein the dielectric liner is a non-porous conformal liner.

15. The system as claimed in claim 11 wherein the barrier layer is a material selected from a group consisting of tantalum, titanium, tungsten, a compound thereof, and a combination thereof.

16. The system as claimed in claim 11 wherein:
    the ultra-low dielectric constant dielectric layer is a dielectric material having a dielectric constant under 2.5; and
    the dielectric liner covers pores in the ultra-low dielectric constant dielectric layer.

17. The system as claimed in claim 16 wherein the dielectric liner is a material with a dielectric constant under 4.2.

18. The system as claimed in claim 16 wherein the dielectric liner is a material with a dielectric constant under 3.9.

19. The system as claimed in claim 16 wherein the dielectric liner is a non-porous conformal liner of a thickness in the range from 6.4 to 2.4 nm.

20. The system as claimed in claim 16 wherein the barrier layer is a material selected from a group consisting of tantalum, titanium, tungsten, a compound thereof, and a combination thereof.

* * * * *